(12) United States Patent
Saito

(10) Patent No.: US 9,702,890 B2
(45) Date of Patent: Jul. 11, 2017

(54) MOUNTING BOARD, SENSOR UNIT, ELECTRONIC APPARATUS, AND MOVING BODY

(71) Applicant: Seiko Epson Corporation, Tokyo (JP)

(72) Inventor: Yoshikuni Saito, Suwa (JP)

(73) Assignee: Seiko Epson Corporation (JP)

( * ) Notice: Subject to any disclaimer, the term of this patent is extended or adjusted under 35 U.S.C. 154(b) by 196 days.

(21) Appl. No.: 14/176,444

(22) Filed: Feb. 10, 2014

(65) Prior Publication Data

US 2014/0254118 A1 Sep. 11, 2014

(30) Foreign Application Priority Data

Mar. 11, 2013 (JP) ................. 2013-047722

(51) Int. Cl.
| | |
|---|---|
| *H05K 7/00* | (2006.01) |
| *G01P 1/02* | (2006.01) |
| *G01P 1/00* | (2006.01) |
| *H05K 1/02* | (2006.01) |
| *H05K 7/10* | (2006.01) |
| *H05K 1/16* | (2006.01) |
| *H05K 1/11* | (2006.01) |

(52) U.S. Cl.
CPC .............. *G01P 1/023* (2013.01); *G01P 1/006* (2013.01); *H05K 1/0219* (2013.01); *H05K 1/111* (2013.01); *H05K 2201/10151* (2013.01)

(58) Field of Classification Search
CPC ....... H01L 2924/01079; H01L 25/0657; H01L 2924/00; H01L 2924/3025; H01L 2224/48247; H01L 2924/10253; H01L 2924/1461; H01L 2924/15747; H01L 2924/15787; H01L 2924/15788; H01L 2224/49171; H01L 2924/14; H01L 2924/13091; H01L 2224/48465; H01L 2224/49175; H05K 1/111
USPC ........ 361/760, 767, 770, 777, 780, 783, 800
See application file for complete search history.

(56) References Cited

U.S. PATENT DOCUMENTS

| | | | |
|---|---|---|---|
| 7,040,922 B2 | 5/2006 | Harney et al. | |
| 7,042,056 B2* | 5/2006 | Koshido | H03H 3/08 |
| | | | 257/414 |
| 7,622,684 B2* | 11/2009 | Takano | H03H 3/08 |
| | | | 174/521 |
| 2009/0255535 A1 | 10/2009 | Kanzer | |
| 2012/0126664 A1* | 5/2012 | Ogura | G01C 19/5607 |
| | | | 310/312 |

(Continued)

FOREIGN PATENT DOCUMENTS

| | | |
|---|---|---|
| JP | 05-340960 | 12/1993 |
| JP | 07-306047 | 11/1995 |

(Continued)

*Primary Examiner* — Binh Tran
(74) *Attorney, Agent, or Firm* — Harness, Dickey & Pierce, P.L.C.

(57) ABSTRACT

A board main body of a board has a sensor mounting area, in which a physical quantity sensor is mounted, disposed on a surface. A non-electrode forming part and a plurality of electrodes are disposed in the sensor mounting area, the electrodes being disposed so as to be isolated from each other, and to correspond to mounting terminals of the physical quantity sensor. A shield electrode is disposed outside the sensor mounting area.

13 Claims, 10 Drawing Sheets

(56) References Cited

U.S. PATENT DOCUMENTS

2013/0307094 A1\* 11/2013 Yoshiuchi .......... G01C 19/5783
  257/415
2014/0092051 A1\* 4/2014 Weinerth ................ G06F 3/044
  345/174
2015/0123243 A1\* 5/2015 Tomita ................ H01L 23/5223
  257/532

FOREIGN PATENT DOCUMENTS

| JP | 11-211481 | 8/1999 |
| JP | 11-289141 | 10/1999 |
| JP | 2001-102746 A | 4/2001 |
| JP | 2002-009228 A | 1/2002 |
| JP | 2003-037367 A | 2/2003 |
| JP | 2005-197493 A | 7/2005 |
| JP | 2006-157067 A | 6/2006 |
| JP | 2007-195145 A | 8/2007 |

\* cited by examiner

MOUNTING BOARD, SENSOR UNIT, ELECTRONIC APPARATUS, AND MOVING BODY

BACKGROUND

1. Technical Field

The present invention relates to a mounting board on which a physical quantity sensor is mounted, a sensor unit using such a mounting board, an electronic apparatus and a moving body using the sensor unit, and so on.

2. Related Art

A physical quantity sensor such as an acceleration sensor or an angular velocity sensor is known widely. The physical quantity sensor is mounted on a mounting board with terminals. A land grid array, for example, can be used as the terminals. The land grid array is formed of a plurality of electrodes arranged in a line along the contour of the physical quantity sensor. The electrodes might be arranged, for example, in a line along a side of a rectangular contour in some cases, or might form a line so as to go round the contour in some cases. In general, a solid film of a conductive material is formed in the periphery of the electrodes. Such a solid film is connected to, for example, the ground. The solid film functions as a so-called shield electrode.

JP-A-2007-195145 discloses the related art.

The physical quantity sensor has a temperature characteristic. An output signal in an unloaded state (when no physical quantity to be detected acts on the sensor), namely a zero-point voltage, varies in accordance with the temperature variation. Such a variation is compensated in accordance with the temperature variation. According to the observation by the inventors, it has been found out that if the solid film of the conductive material is formed in the periphery of the electrodes without a space, a singularity (hereinafter referred to as "bias shift") occurs in a certain specific temperature range in a hysteresis (see, e.g., FIG. 9) of the temperature characteristic of the physical quantity sensor as indicated in the part surrounded by the circle. If such bias shift occurs, the zero-point voltage is made dramatically different in the certain specific temperature range, and it has been unachievable to easily realize a preferable temperature compensation.

SUMMARY

An advantage of some aspects of the invention is to provide a mounting board used for mounting a physical quantity sensor capable of preferably maintaining the temperature characteristic of the physical quantity sensor.

(1) An aspect of the invention relates to amounting board including a board main body having a sensor mounting area, in which a physical quantity sensor is mounted, disposed on a surface, wherein a non-electrode forming part and a plurality of electrodes are disposed in the sensor mounting area, the electrodes being disposed on the surface so as to be isolated from each other, and to correspond to mounting terminals of the physical quantity sensor, and a shield electrode is disposed outside the sensor mounting area.

In such a mounting board as described above, the area of the conductive film is shrunk as much as possible in the sensor mounting area. As a result, the deformation due to the thermal expansion of the conductive film is suppressed on the surface of the board main body. When the temperature changes, the relative displacement and the change in orientation between the electrodes are prevented. The temperature characteristic of the physical quantity sensor to be mounted in the sensor mounting area is preferably maintained. On the other hand, if the shield electrode (a ground film) of the conductive material is formed in the sensor mounting area, the relative displacement or the change in orientation occurs between the electrodes in accordance with the temperature variation, and such a displacement or a change in orientation acts on the terminals of the physical quantity sensor to cause a distortion or a stress in the physical quantity sensor. The bias shift might occur in the temperature characteristic of the physical quantity sensor due to the influence of such a distortion or a stress in some cases.

(2) At least two of the electrodes may be same potential electrodes set to have a same potential. Even if the potentials are the same, the two electrodes are electrically separated from each other in the sensor mounting area. The conductive film is not formed between the two electrodes. As a result, the deformation due to the thermal expansion of the conductive film is suppressed between the two electrodes. When the temperature changes, the relative displacement and the change in orientation between the electrodes are prevented. The temperature characteristic of the physical quantity sensor to be mounted in the sensor mounting area is preferably maintained.

(3) The same potential electrodes may be connected to each other inside the board main body via a conductive via hole disposed along a thickness direction of the board main body. The same potential electrodes are connected to each other by the via hole. Since the via hole is formed inside the board main body instead of the surface of the board main body, the relative displacement and the change in orientation between the electrodes are prevented on the surface of the board main body when the temperature changes.

(4) The shield electrode may be disposed so as to surround the sensor mounting area on the surface of the board main body. In such a manner, the shield electrode can surely exert the shield function.

(5) The shield electrode may be disposed so as to be separated from the electrodes with a distance larger than a distance between the electrodes. Since the shield electrode is kept away from the sensor mounting area in such a manner as described above, the deformation due to the thermal expansion of the conductive film is more surely suppressed in the sensor mounting area.

(6) Another aspect of the invention relates to a mounting board including a board main body having a sensor mounting area, in which a physical quantity sensor is mounted, disposed on a surface, wherein a non-electrode forming part and a plurality of electrodes are disposed in the sensor mounting area, the electrodes being disposed so as to correspond to mounting terminals of the physical quantity sensor, at least two of the electrodes are same potential electrodes set to have a same potential, and the same potential electrodes are connected to each other by wiring outside the sensor mounting area in a planar view.

Since the wiring is disposed in an area other than the sensor mounting area in such a mounting board as described above, the area of the conductive film is shrunk accordingly in the sensor mounting area. As a result, the deformation due to the thermal expansion of the conductive film is suppressed on the surface of the board main body. When the temperature changes, the relative displacement and the change in orientation between the electrodes are prevented. The temperature characteristic of the physical quantity sensor to be mounted in the sensor mounting area is preferably maintained.

(7) The wiring may be disposed on the surface of the mounting board. Even if the potentials are the same, the two electrodes are electrically separated from each other in the sensor mounting area. The conductive film is not formed between the two electrodes. As a result, the deformation due to the thermal expansion of the conductive film is suppressed between the two electrodes. When the temperature changes, the relative displacement and the change in orientation between the electrodes are prevented. The temperature characteristic of the physical quantity sensor to be mounted in the sensor mounting area is preferably maintained.

(8) The wiring may include a conductive via hole disposed along the thickness direction of the board main body, and the electrodes may be connected to each other inside the board main body via the conductive via hole. Since the conductive via hole is formed inside the board main body instead of the surface of the board main body, the relative displacement and the change in orientation between the electrodes are prevented on the surface of the board main body when the temperature changes.

(9) At least one of the conductive via holes may be disposed outside the sensor mounting area in the planar view. Since the conductive via hole is kept away from the sensor mounting area in such a manner as described above, the deformation due to the thermal expansion of the conductive body is more surely suppressed in the sensor mounting area.

(10) A shield electrode may be disposed outside the sensor mounting area and the wiring on the surface of the mounting board. Since the shield electrode is formed outside the sensor mounting area, the relative displacement and the change in orientation between the electrodes are prevented in the sensor mounting area when the temperature changes.

(11) The mounting board may be used in a sensor unit. On this occasion, the sensor unit is sufficiently provided with the mounting board, and the physical quantity sensor to be mounted in the sensor mounting area of the mounting board.

(12) The mounting board may also be used after being incorporated in an electronic apparatus. On this occasion, the electronic apparatus is sufficiently provided with such a mounting board as described above.

(13) Similarly, the mounting board may also be used after being incorporated in a moving body. On this occasion, the moving body is sufficiently provided with such a mounting board as described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be explained with reference to the accompanying drawings. It should be noted that the present embodiment explained below does not unreasonably limit the content of the invention as set forth in the appended claims, and all of the constituents set forth in the present embodiment are not necessarily essential as means for solving the problems according to the invention.

1. Sensor Unit

Figure 1:
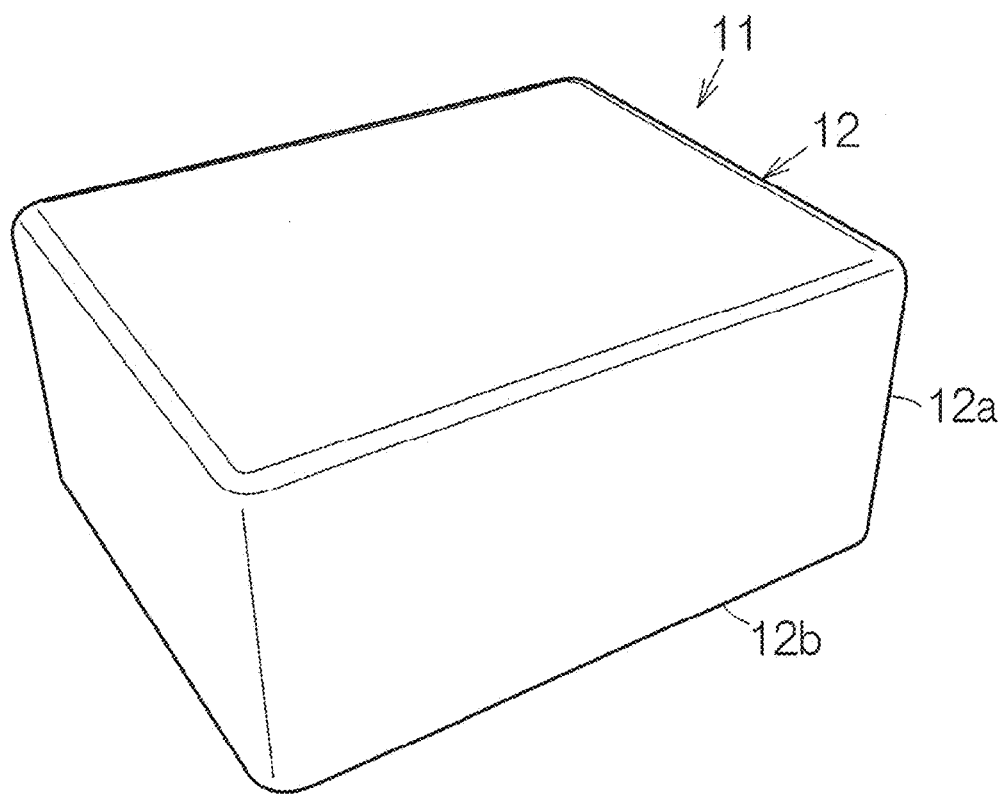
FIG. 1 is a perspective view schematically showing an appearance of a sensor unit according to an embodiment of the invention.

FIG. 1 schematically shows a sensor unit 11 according to an embodiment of the invention. The sensor unit 11 is provided with a housing 12. The housing 12 is formed to have, for example, a rectangular box shape. The housing 12 zones a rectangular parallelepiped internal space. The housing 12 is divided into a box body 12a and a base 12b. The box body 12a covers a top surface and four side surfaces of the internal space. The base 12b covers a bottom surface of the internal space. The box body 12a and the base 12b are each formed of, for example, an aluminum material. The surfaces of the box body 12a and the base 12b each can be covered by, for example, a nickel plating film.

Figure 2:
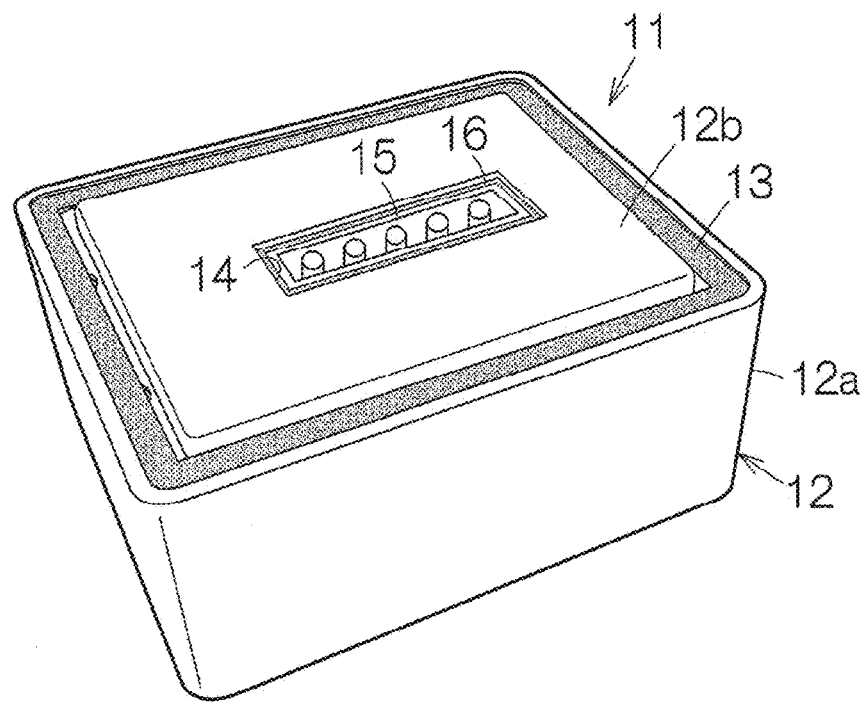
FIG. 2 is a perspective view schematically showing an appearance of the sensor unit viewed from the bottom.

As shown in FIG. 2, the base 12b blocks an opening side of the box body 12a. A space between the base 12b and the box body 12a is filled with a sealing material 13 along the contour of the base 12b. The base 12b is provided with an opening 14. A connector 15 is disposed in the opening 14. The connector 15 can be received by a connector (not shown) on a receiving side. The connector 15 constitutes an external terminal of the sensor unit 11. A space between the connector 15 and the base 12b is filled with a sealing material 16 along the contour of the connector 15. Thus, the internal space of the housing 12 is airtightly sealed.

Figure 3:
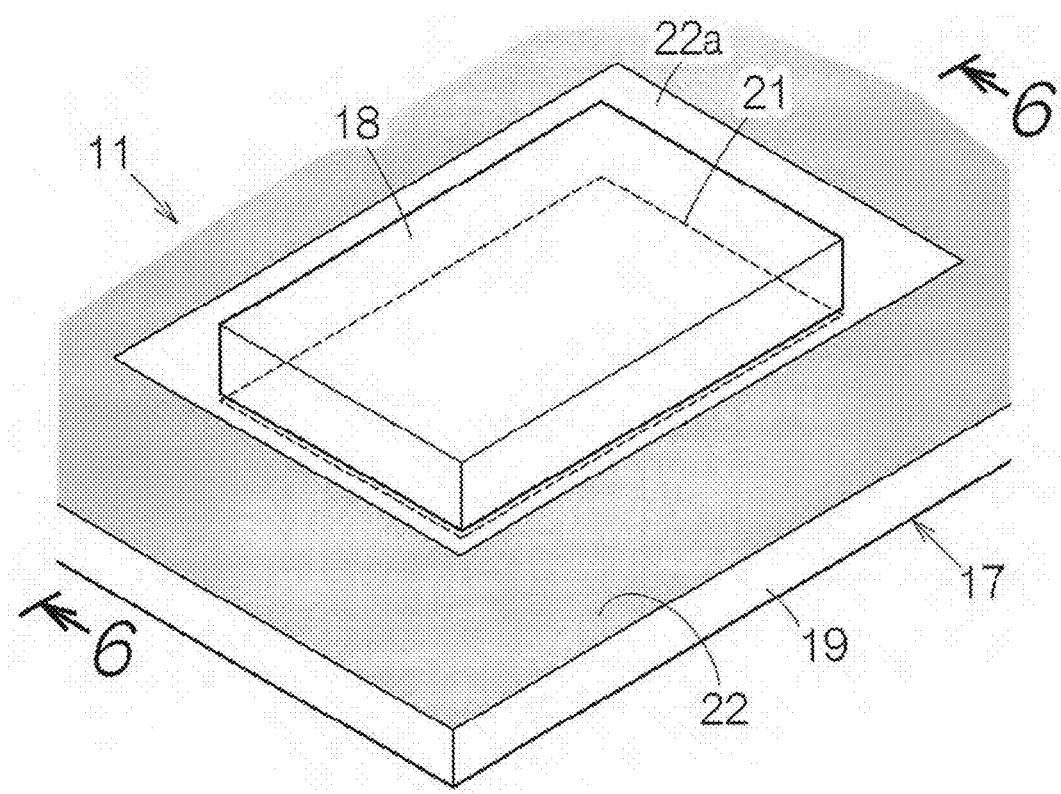
FIG. 3 is a perspective view schematically showing an acceleration sensor mounted on a board according to an embodiment of the invention.

As shown in FIG. 3, the sensor unit 11 is provided with a board (a mounting board) 17 and an acceleration sensor (a physical quantity sensor) 18. The acceleration sensor 18 as the physical quantity sensor is mounted on a surface of the board 17. The acceleration sensor 18 is formed to have, for example, a flat rectangular parallelepiped shape. It should be noted that the acceleration sensor 18 is not required to be formed to have such a rectangular shape in a planar view, but can also be formed to have a square shape or any of other shapes. Such a shape in the planar view corresponds to the contour line of the acceleration sensor 18. The board 17 and the acceleration sensor 18 are housed in the internal space of the housing 12.

The board 17 has a board main body 19 formed of, for example, an insulating material. A sensor mounting area 21 is zoned on the surface of the board main body 19 with a projection image of the acceleration sensor 18. The projection image of the acceleration sensor 18 corresponds to a shadow of the acceleration sensor 18 formed on the surface of the board main body 19 when irradiating the surface of the board main body 19 with a parallel beam from a perpendicular direction. In other words, it can also be said that the sensor mounting area 21 is a contour area of the acceleration sensor 18 after mounting the acceleration sensor 18 in the planar view.

The board 17 is provided with a shield electrode (a conductive film for shielding) 22. The shield electrode 22 is formed on the surface of the board main body 19 outside the sensor mounting area 21. The shield electrode 22 is formed of a solid film of metal such as copper or any of other conductive materials. The shield electrode 22 is provided with, for example, the ground potential. As described later, the shield electrode 22 is disposed away from the sensor mounting area 21 with a predetermined distance. The shield electrode 22 includes a non-electrode forming part 22a. The sensor mounting area 21 is zoned in the non-electrode forming part 22a. In the non-electrode forming part 22a, the shield electrode 22 is not formed on the surface of the board main body 19.

Figure 4:
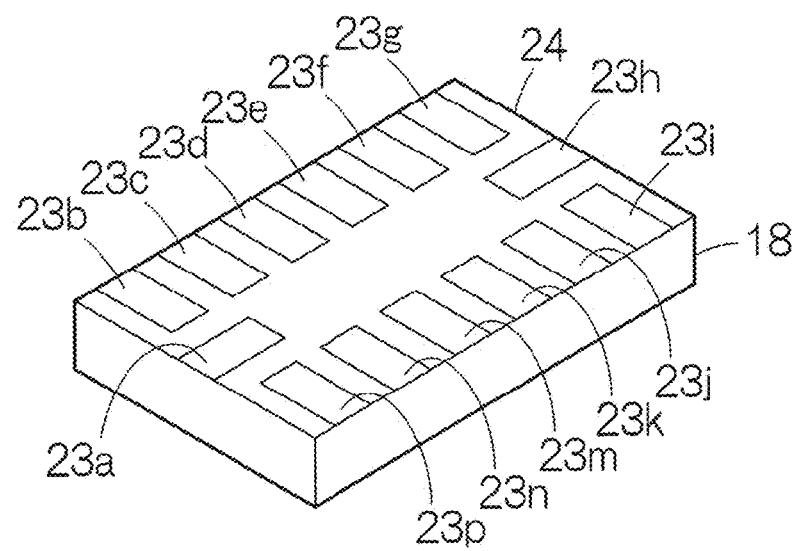
FIG. 4 is a perspective view schematically showing an appearance of the acceleration sensor viewed from the bottom.

As shown in FIG. 4, the acceleration sensor 18 is provided with a plurality of electrode terminals (mounting terminals) 23a, 23b, . . . , 23p. The electrode terminals (mounting terminals) 23a, 23b, . . . , 23p are arranged along the contour line 24 of the acceleration sensor 18 in, for example, a single line. Here, the electrode terminals (mounting terminals) 23a, 23b, . . . , 23p form a line so as to make a round of the contour of the acceleration sensor 18. The electrode terminals 23a, 23b, and 23c output acceleration signals for the respective axes of the three perpendicular axes. The electrode terminal 23d is connected to the ground. The electrode terminals 23g through 23k, 23m, and 23p are connected to the power supply. Each of the electrode terminals 23a, 23b, . . . , 23p is formed of a pad of a conductive material such as copper.

Figure 5:
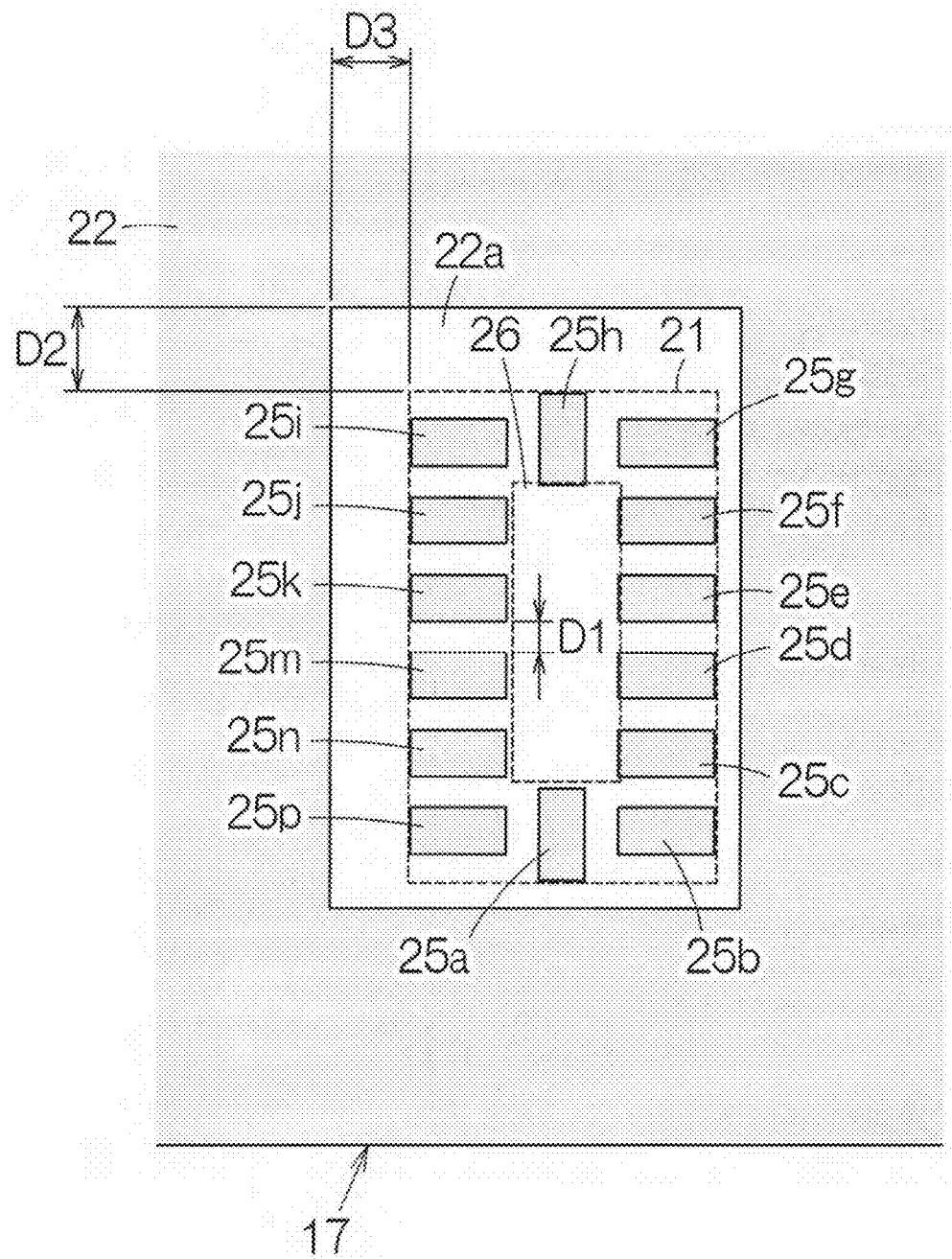
FIG. 5 is an enlarged plan view schematically showing a structure of a surface of the board.

As shown in FIG. 5, the board 17 is provided with a plurality electrodes, namely conductive pads 25a, 25b, . . . , 25p, disposed in the non-electrode forming part 22a. The conductive pads 25a, 25b, . . . , 25p are formed on the surface of the board main body 19. The conductive pads 25a, 25b, . . . , 25p are disposed in the sensor mounting area 21. The conductive pads 25a, 25b, . . . , 25p are disposed in a single line along the contour line of the sensor mounting area 21 in the periphery of a surface 26, which is formed of the insulating material of the board main body 19 in the sensor mounting area 21. The arrangement of the conductive pads 25a, 25b, . . . , 25p reflects the arrangement of the electrode terminals 23a, 23b, . . . , 23p. Therefore, the conductive pads 25a, 25b, . . . , 25p are disposed in the non-electrode forming part 22a so as to be isolated from each other. The electrode terminals 23a, 23b, and 23c are bonded individually to the corresponding conductive pads 25. The electrode terminal (the ground terminal) 23e is bonded to the conductive pad 25e. The electrode terminals 23g through 23k, 23m, and 23p are bonded to the conductive pads 25g through 25k, 25m, and 25p, respectively. Therefore, the conductive pads 25g through 25k, 25m, and 25p constitute the electrodes (the same potential electrodes) at the same potential. Even if the potentials are the same, the conductive pads 25g through 25k, 25m, and 25p are separated from each other on the surface of the board main body 19. Here, as is obvious from FIG. 5, in the two sides of the rectangle, in which at least the conductive pads 25g through 25k, 25m, and 25p at the same potential are arranged, the shield electrode 22 is disposed at a position separated from the conductive pads 25g through 25k, 25m, and 25p with the distances D2, D3 larger than the distance D1 between the conductive pads 25g through 25k, 25m, and 25p adjacent to each other in the line direction of the single line.

Figure 6:
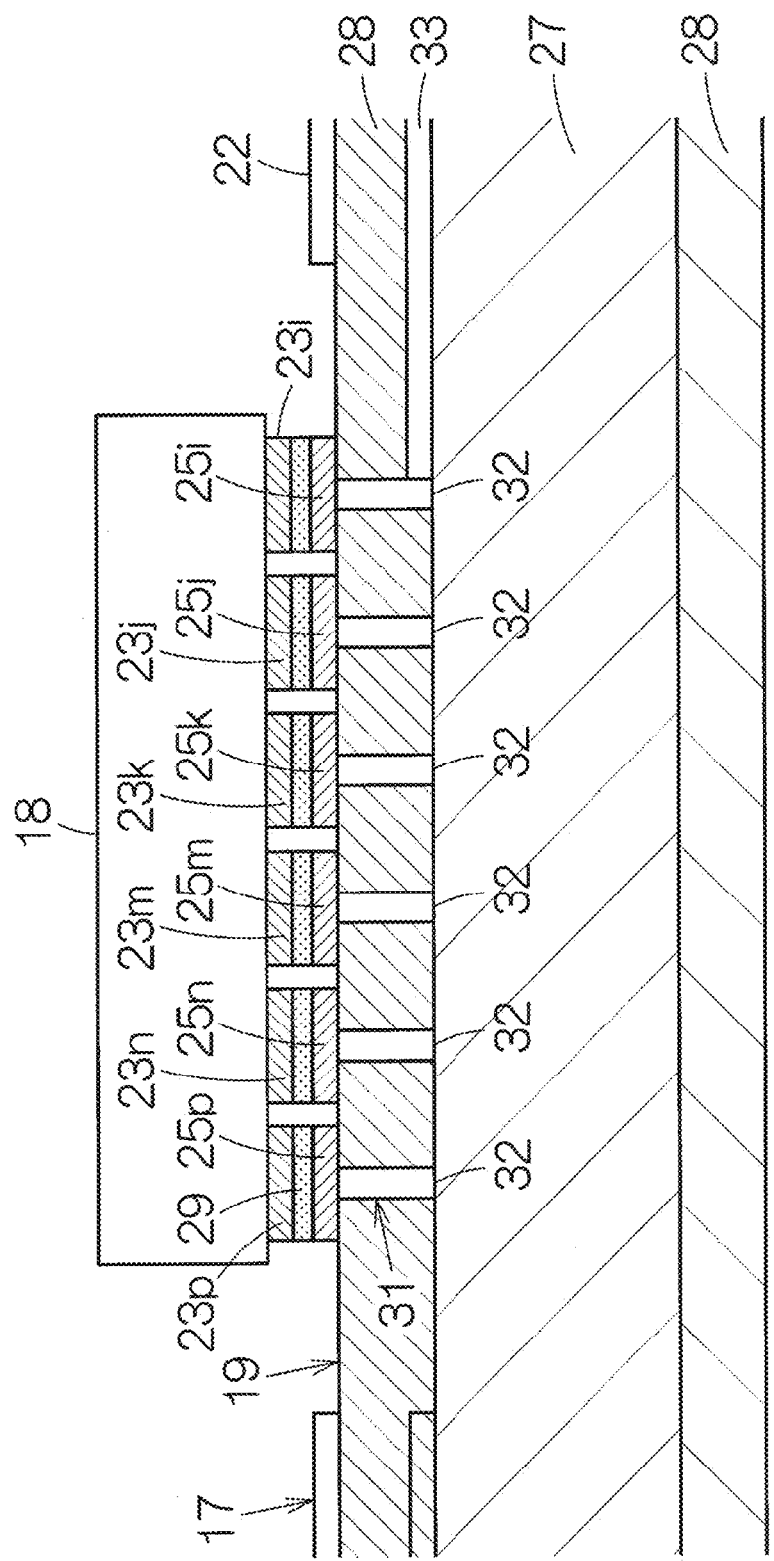
FIG. 6 is a cross-sectional view along the 6-6 line shown in FIG. 3.

As shown in FIG. 6, the board main body 19 is provided with a core layer 27 and build-up layers 28 disposed on obverse and reverse sides of the core layer 27. The core layer 27 has rigidity with which, for example, the core layer maintains the shape by itself. The core layer 27 can be a single layer, or a laminated body of prepreg. The build-up layers 28 are stacked respectively on the obverse and reverse sides of the core layer 27. The core layer 27 and the build-up layers 28 each form an insulating layer. The insulating layers are made of resin. The resin is impregnated with a carbon fiber or a glass fiber. The conductive pads 25a, 25b, . . . , 25p (only some of the conductive pads are shown in FIG. 6) are formed on the surface of the build-up layer 28. The electrode terminals 23a, 23b, . . . , 23p are bonded to the corresponding conductive pads 25a, 25b, . . . , 25p with, for example, solder 29.

Electrically conductive bodies 31 formed of a conductive material are incorporated in the board main body 19. The conductive bodies 31 are connected respectively to the conductive pads 25d, and 25f through 25p at one ends. For achieving the connection, a plurality of via holes 32 is formed in the build-up layer 28. Each of the via holes 32 individually extends from corresponding one of the conductive pads 25d, and 25f through 25p, and penetrates at least the most superficial insulating layer among the insulating layers, namely the build-up layer 28. The via holes 32 extend in a direction perpendicular to the surface of the build-up layer 28, namely the thickness direction of the board main body 19, in parallel to each other. The conductive bodies 31 are disposed in the respective via holes 32, and the via holes 32 function as conductive via holes.

Figure 7:
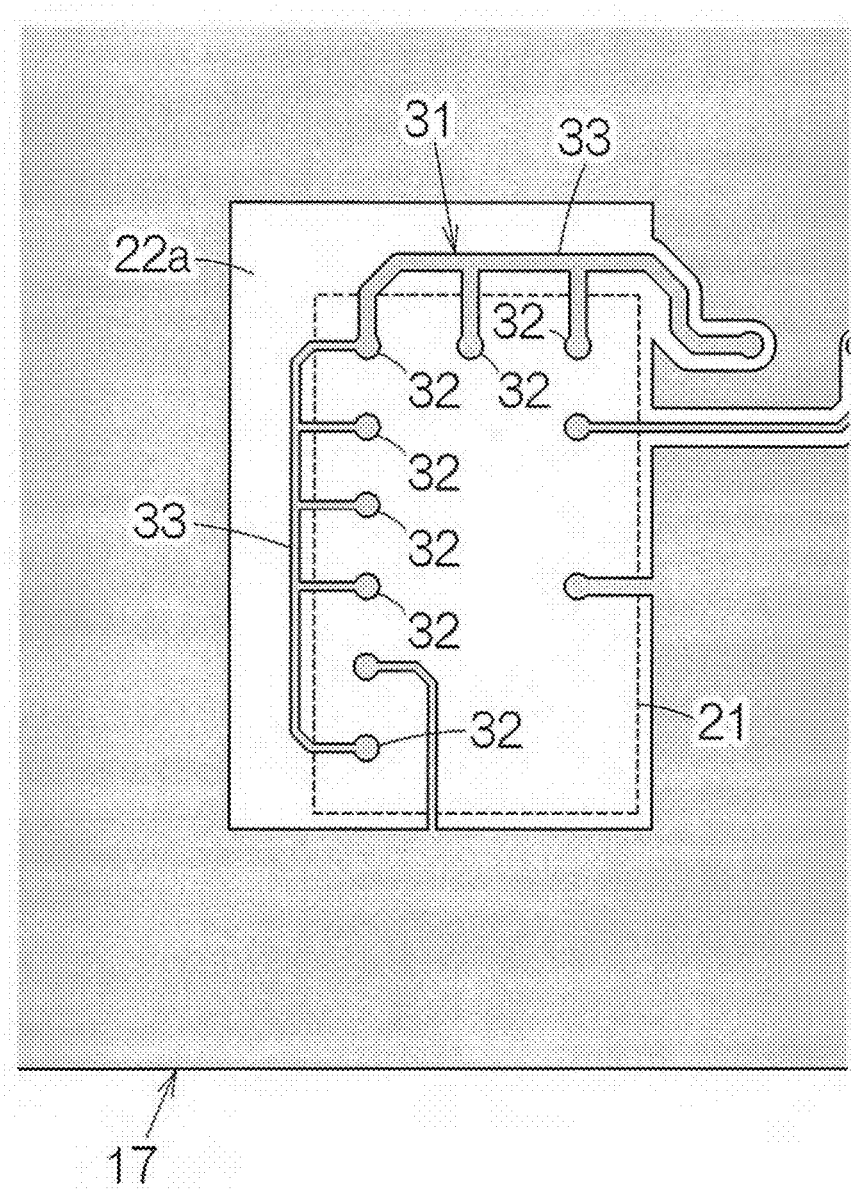
FIG. 7 is a plan view of a core layer schematically showing a pattern of a conductive layer.

The conductive bodies 31 include a conductive layer 33 functioning as wiring. The conductive layer 33 extends between the insulating layers. Here, the conductive layer 33 extends between the core layer 27 and the build-up layer 28. As shown in FIG. 7, the conductive layer 33 forms a conductive pattern on the surface of the core layer 27. The conductive layer 33 connects the via holes 32 to each other. In such a manner as described above, the conductive pads 25d, and 25f through 25p are connected to each other with the conductive bodies 31. Here, as is obvious from FIG. 7, the 7 conductive pads 25g through 25m, and 25p are commonly connected to each other. The conductive layer 33 is at least partially disposed outside the sensor mounting area 21 in the planar view. In the two sides on which the conductive layer 33 is located, the shield electrode 22 is kept further from the sensor mounting area 21 compared to the other two sides.

In such a board 17 as described above, the surface 26, which is formed of the insulating material between a line of conductive pads 25b through 25g and a line of conductive pads 25i through 25n each arranged along the long side of the rectangle in the sensor mounting area 21, is ensured with a sufficient size. The area of the conductive film is shrunk as much as possible in the sensor mounting area 21. As a result, the deformation due to the thermal expansion of the conductive film is suppressed on the surface of the board main body 19. When the temperature changes, the relative displacement and the change in orientation between the conductive pads 25a, 25b, . . . , 25p are prevented. The temperature characteristic of the acceleration sensor 18 to be mounted in the sensor mounting area 21 is preferably maintained.

In addition, in the board 17, even if the potentials are the same, the plurality of conductive pads 25g through 25k, 25m, and 25p is electrically separated from each other in the sensor mounting area 21. The conductive film is not formed between the plurality of conductive pads 25g through 25k, 25m, and 25p. As a result, the deformation due to the thermal expansion of the conductive film is suppressed between the plurality of conductive pads 25g through 25k, 25m, and 25p. When the temperature changes, the relative displacement and the change in orientation are prevented between the conductive pads 25g through 25k, 25m, and 25p. Here, the conductive pads 25g through 25k, 25m, and 25p at the same potential are connected to each other with the conductive bodies 31. Since the conductive bodies 31 are not formed on the surface but formed in the inside of the board main body 19, the relative displacement and the change in orientation are prevented between the conductive pads 25g through 25k, 25m, and 25p in the surface of the board main body 19 when the temperature changes. The temperature characteristic of the acceleration sensor 18 to be mounted in the sensor mounting area 21 is preferably maintained. Moreover, the conductive bodies 31 are at least partially disposed outside the sensor mounting area 21 in the planar view. The conductive bodies 31 are kept away from the sensor mounting area 21. Therefore, the deformation due to the thermal expansion of the conductive bodies 31 is more surely suppressed in the sensor mounting area 21.

Further, in the board 17, the shield electrode 22 is disposed at the position separated from the conductive pads 25a, 25b, . . . , 25p with the distances D2, D3 larger than the distance D1 between the conductive pads 25a, 25b, . . . , 25p adjacent to each other in the line direction of the single line. Since the shield electrode 22 is kept away from the sensor mounting area 21 in such a manner as described above, the deformation due to the thermal expansion of the conductive bodies is more surely suppressed in the sensor mounting area 21.

Figure 8:
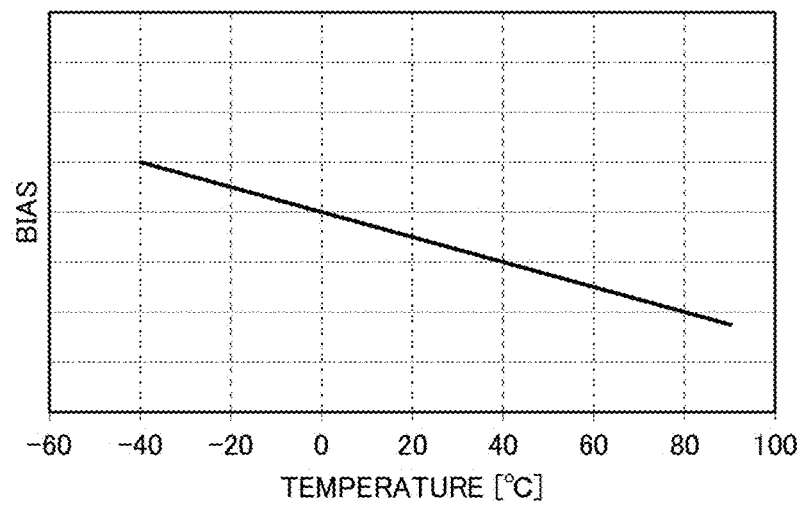
FIG. 8 is a graph showing the temperature characteristic of the acceleration sensor based on the present embodiment.

The inventors have verified the technical effect of the present embodiment. The output signal in an unloaded state (when no physical quantity to be detected acts on the sensor), namely the zero-point voltage, has been measured in accordance with the temperature variation. As a result, as shown in FIG. 8, according to the present embodiment, the zero-point voltage has varied linearly with respect to the temperature variation. It has been confirmed that according to the present embodiment, the temperature characteristic of the acceleration sensor 18 to be mounted in the sensor mounting area 21 is preferably maintained.

Figure 9:
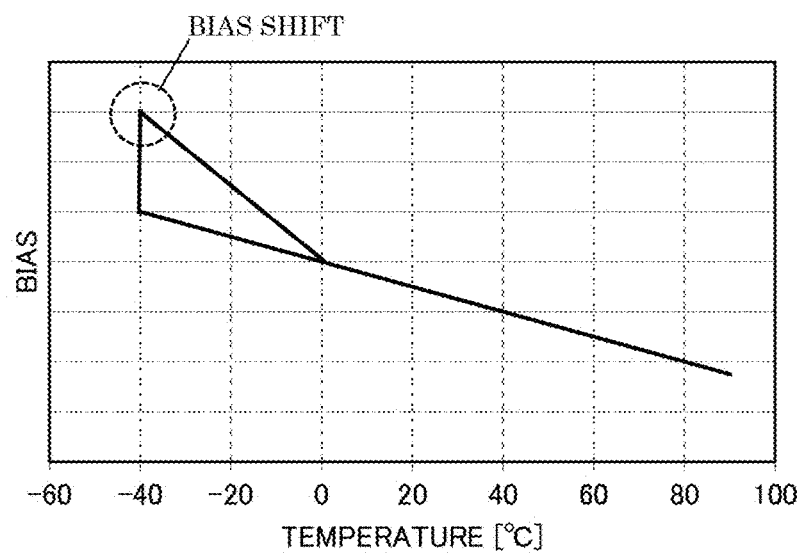
FIG. 9 is a graph showing the temperature characteristic of the acceleration sensor based on a comparative example.

The inventors have verified a comparative examples. In the comparative examples, the shield electrode (a ground film) made of a conductive material is formed in the sensor mounting area 21. Similarly, the zero-point voltage in the unloaded state has been measured in accordance with the temperature variation. As a result, as shown in FIG. 9, the singularity (the bias shift) has occurred in a certain temperature range of the temperature characteristic of the acceleration sensor. It is thought to be the cause that the relative displacement or the change in orientation has occurred between the electrodes in accordance with the temperature variation, and such a displacement or a change in orientation has acted on the terminals of the physical quantity sensor to cause a distortion or a stress in the physical quantity sensor.

In such a case, even at the same temperature, the zero-point voltage is made different between rise in temperature and fall in temperature, and it is unachievable to easily realize the preferable temperature compensation.

Figure 10:
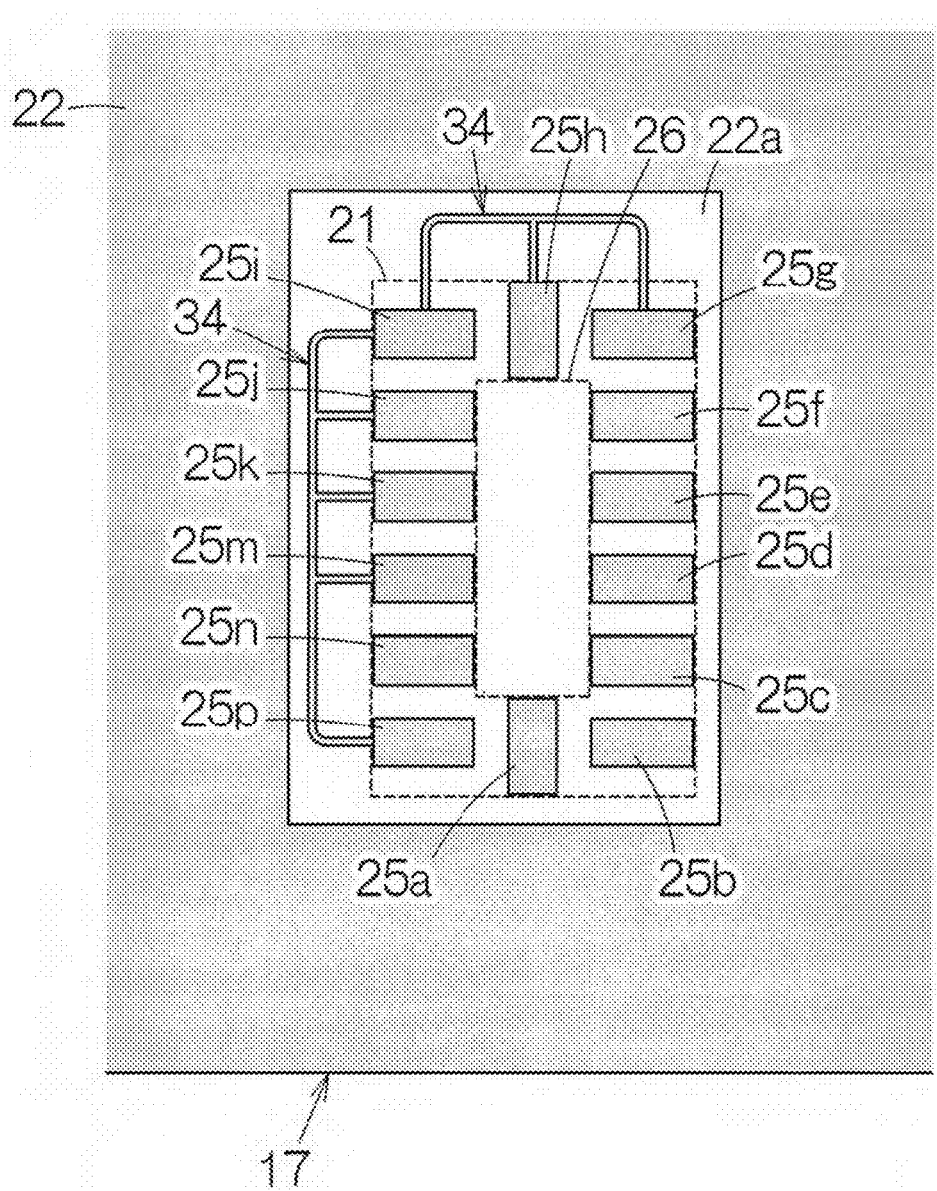
FIG. 10 is a diagram showing a modified example of a conductive body corresponding to FIG. 5, and is an enlarged plan view schematically showing the structure of the surface of the board.

It is also possible for the wiring 34 for connecting the electrodes 25g through 25p having the same potential to each other to be formed on the surface of the board main body 19 as shown in FIG. 10. In this case, the wiring 34 is disposed outside the sensor mounting area 21. The wiring 34 is formed of a conductive pattern formed on the surface of the board main body 19.

It is also possible for the conductive pattern to be formed of a conductive material such as copper. Since the conductive pattern is formed outside the sensor mounting area 21, the relative displacement and the change in orientation are prevented between the conductive pads 25a, 25b, . . . , 25p in the sensor mounting area 21 when the temperature changes.

Figure 11:
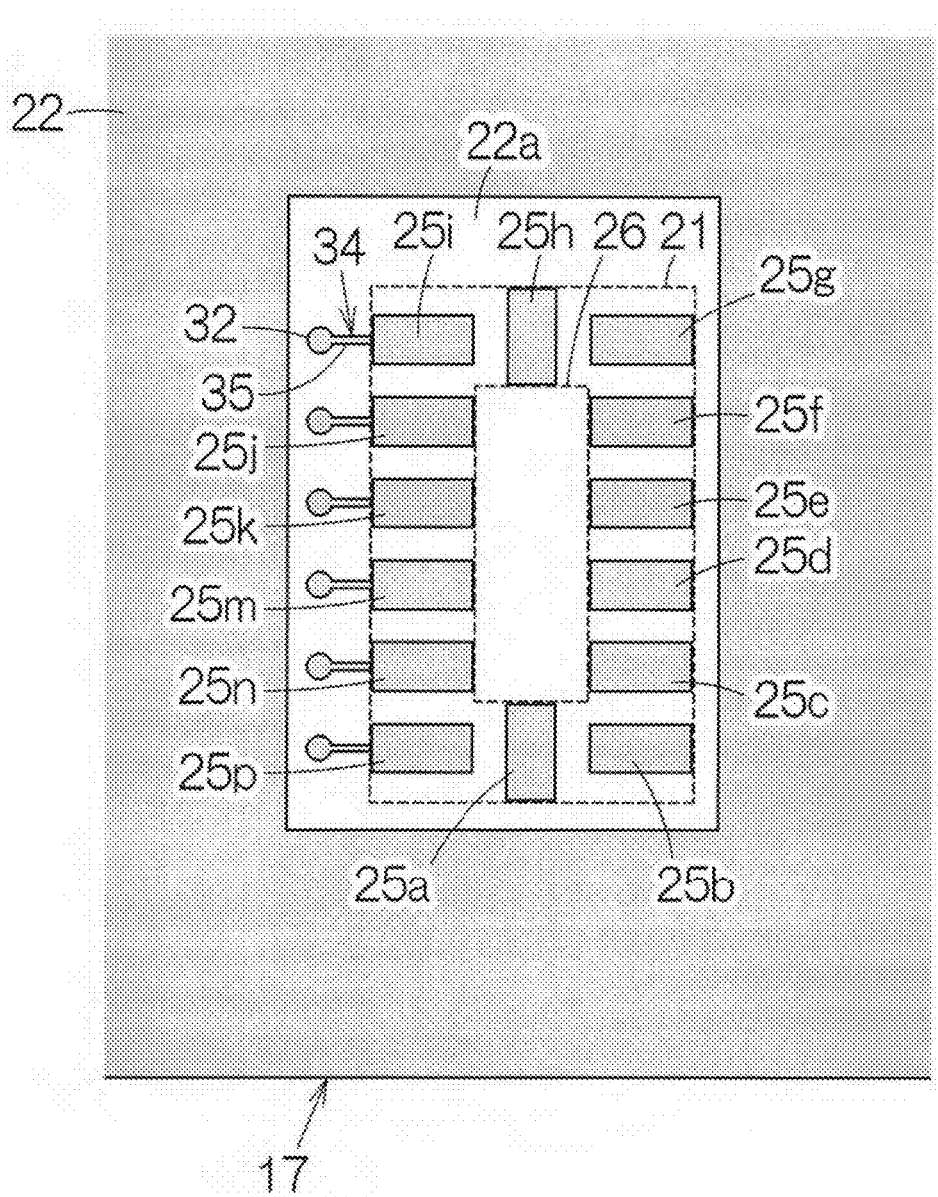
FIG. 11 is a diagram showing a modified example of the conductive body corresponding to FIG. 5, and is an enlarged plan view schematically showing the structure of the surface of the board.

Besides the above, it is also possible for the wiring 34 to have the via holes 32 functioning as the conductive via holes outside the sensor mounting area 21 as shown in FIG. 11. The wiring 34 has a conductive pattern 35 for individually connecting the corresponding conductive pads 25i through 25p to the via holes 32 on the surface of the board main body 19. Since the conductive pattern 35 is formed outside the sensor mounting area 21, the relative displacement and the change in orientation are prevented between the conductive pads 25a, 25b, . . . , 25p in the sensor mounting area 21 when the temperature changes.

2. Application Example of Sensor Unit

Figure 12:
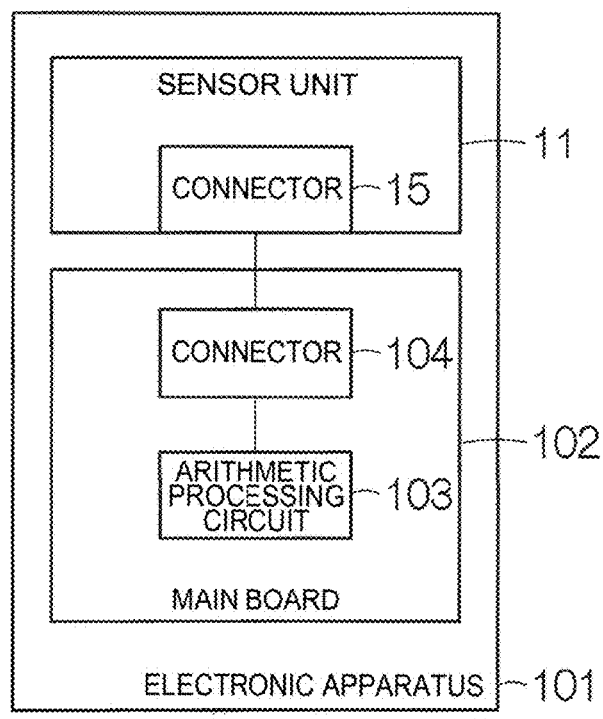
FIG. 12 is a block diagram schematically showing a configuration of an electronic apparatus according to an embodiment of the invention.

Such a sensor unit 11 as described hereinabove is used after being incorporated in an electronic apparatus 101 as shown in, for example, FIG. 12. In the electronic apparatus 101, an arithmetic processing circuit 103 and a connector 104 are mounted on, for example, a main board 102. The connector 15 of the sensor unit 11, for example, is connected to the connector 104. The arithmetic processing circuit 103 is supplied with the detection signal from the sensor unit 11. The arithmetic processing circuit 103 processes the detection signal from the sensor unit 11, and then outputs the processing result. As examples of the electronic apparatus 101, there are cited, for example, a motion sensing unit, a consumer gaming machine, a motion analysis device, a surgical operation navigation system, and a vehicle navigation system.

Figure 13:
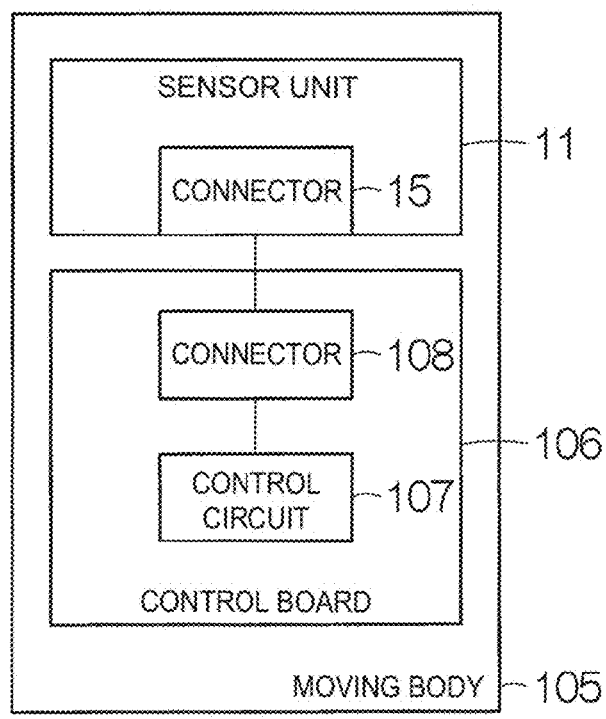
FIG. 13 is a block diagram schematically showing a configuration of a moving body according to an embodiment of the invention.

As shown in, for example, FIG. 13, the sensor unit 11 is used after being incorporated in a moving body 105. In the moving body 105, a control circuit 107 and a connector 108 are mounted on, for example, a control board 106. The connector 15 of the sensor unit 11, for example, is connected to the connector 108. The control circuit 107 is supplied with the detection signal from the sensor unit 11. The control circuit 107 is capable of processing the detection signal from the sensor unit 11, and then controlling the motion of the moving body 105 in accordance with the processing result. As examples of such control, there are cited behavior control of the moving body, vehicle navigation control, start control of a vehicle air-bag system, inertial navigation control of an airplane and a ship, guidance control, and so on.

Figure 14:
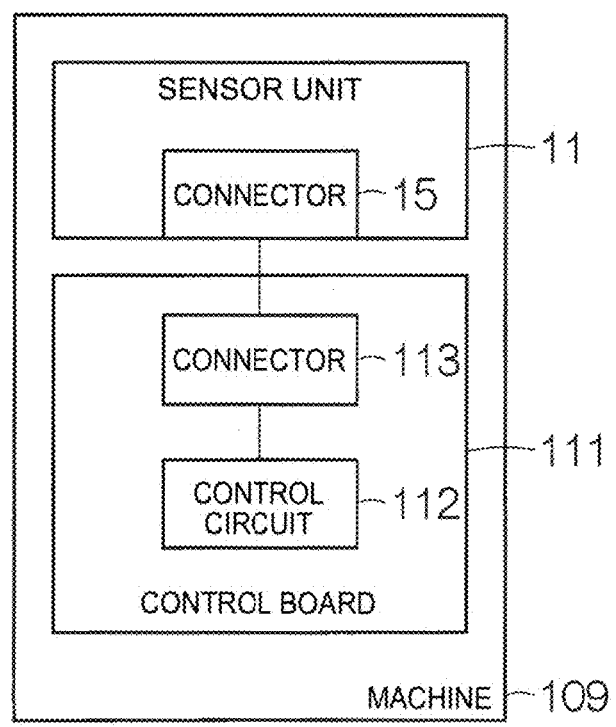
FIG. 14 is a block diagram schematically showing a configuration of a machine according to an embodiment of the invention.

As shown in, for example, FIG. 14, the sensor unit 11 is used after being incorporated in a machine 109. In the machine 109, a control circuit 112 and a connector 113 are mounted on, for example, a control board 111. The connector 15 of the sensor unit 11, for example, is connected to the connector 113. The control circuit 112 is supplied with the detection signal from the sensor unit 11.

The control circuit 112 is capable of processing the detection signal from the sensor unit 11, and then controlling the operation of the machine 109 in accordance with the processing result. As examples of such control, there are cited vibration control and motion control of an industrial machine, motion control of a robot, and so on.

It should be noted that although the present embodiments are hereinabove explained in detail, it should easily be understood by those skilled in the art that it is possible to make a variety of modifications not substantially departing from the novel matters and the advantages of the invention. Therefore, such modified examples are all included in the scope of the invention. For example, a term described at least once with a different term having a broader sense or the same meaning in the specification or the accompanying drawings can be replaced with the different term in any part of the specification or the accompanying drawings. Further, the configurations and the operations of the sensor unit 11, the board 17, the acceleration sensor 18, and so on are not limited to those explained in the present embodiments, but can variously be modified.

The entire disclosure of Japanese Patent Application No. 2013-047722, filed Mar. 11, 2013 is expressly incorporated by reference herein.

What is claimed is:

1. A sensor unit comprising:
a physical quantity sensor; and
a mounting board holding the physical quantity sensor, the mounting board including:
a board main body with a top surface, the top surface of the board main body having:
a sensor mounting area that is in a rectangular shape, the physical quantity sensor being mounted in the sensor mounting area;
a first ring area that is located outside of the sensor mounting area in a plan view so as to surround the sensor mounting area; and
a second ring area that is provided between a peripheral of the top surface of the board main body and an outer circumference of the first ring area so that the second ring area surrounds the first ring area in the plan view;
a plurality of electrodes located on the sensor mounting area along a peripheral of the sensor mounting area, the plurality of electrodes being electrically connected to electrodes of the physical quantity sensor; and
a shield electrode that is located on the second ring area along an outer peripheral of the first ring area,
wherein the shield electrode is connected to a ground potential, and
a first part of the first ring area is wider than the other parts of the first ring area, and a wiring which connects at least one of the plurality of electrodes to another of the plurality of electrodes is provided at the first part of the first ring area.

2. The sensor unit according to claim 1, wherein at least two of the plurality of electrodes have the same potential.

3. The sensor unit according to claim 2, wherein the at least two of the plurality of electrodes are connected to each other inside the board main body via a conductive via hole formed along a thickness direction of the board main body.

4. The sensor unit according to claim 1, wherein the shield electrode surrounds the sensor mounting area in the plan view.

5. The sensor unit according to claim 1, wherein the shield electrode is laterally shifted from the plurality of electrodes by a distance that is larger than a distance between adjacent two of the plurality of electrodes.

6. An electronic apparatus comprising:
the sensor unit according to claim 1.

7. A moving body comprising:
the sensor unit according to claim 1.

8. A sensor unit comprising:
a physical quantity sensor; and
a mounting board holding the physical quantity sensor, the mounting board including:
a board main body with a top surface, the top surface of the board main body having:
a sensor mounting area that is in a rectangular shape, the physical quantity sensor being mounted in the sensor mounting area;
a first ring area that is located outside of the sensor mounting area in a plan view so as to surround the sensor mounting area; and
a second ring area that is provided between a peripheral of the top surface of the board main body and an outer circumference of the first ring area so that the second ring area surrounds the first ring area in the plan view;
a plurality of electrodes located on the sensor mounting area along a peripheral of the sensor mounting area, the plurality of electrodes being electrically connected to electrodes of the physical quantity sensor; and
a wiring that is located outside of the sensor mounting area in the plan view,
wherein at least two of the plurality of electrodes have the same potential,
the at least two of the plurality of electrodes are electrically connected to each other via the wiring, and
a first part of the first ring area is wider than the other parts of the first ring area, and the wiring is provided at the first part of the first ring area.

9. The sensor unit according to claim 8, wherein the wiring includes a conductive via hole formed along the thickness direction of the board main body, and the at least two of the plurality of electrodes are connected to each other inside the board main body via the conductive via hole.

10. The sensor unit according to claim 9, wherein at least one of the conductive via holes is disposed outside the sensor mounting area in the planar view.

11. The sensor unit according to claim 8, wherein a shield electrode is located on the second ring area along an outer peripheral of the first ring area and outside of the wiring in the plan view.

12. An electronic apparatus comprising:
the sensor unit according to claim 8.

13. A moving body comprising:
the sensor unit according to claim 8.

* * * * *